CURRENT AMPLIFYING SCANNING CIRCUIT

Filed July 12, 1967

INVENTOR

E. A. W Muenter

BY Alfred C. Hill

AGENT

United States Patent Office 3,522,450
Patented Aug. 4, 1970

3,522,450

CURRENT AMPLIFYING SCANNING CIRCUIT

Ernst A. W. Muenter, Montreal, Quebec, Canada, assignor to International Standard Electric Corporation, New York, N.Y., a corporation of Delaware Filed July 12, 1967, Ser. No. 652,925
Claims priority, application Germany, July 14, 1966, St 25,639
Int. Cl. H03k 11/00
U.S. Cl. 307—243 9 Claims

ABSTRACT OF THE DISCLOSURE

A plurality of input leads are coupled one at a time to a single output lead by a differential amplifier having a single output stage and a plurality of input stages each coupled to one of the input leads with the input stages being coupled one at a time to the output stage by a switching control arrangement coupled between each of the input stages and the output stage. The output stage is coupled to the output lead by an amplifier with the signal on the output lead being fed back to the output stage.

BACKGROUND OF THE INVENTION

This invention relates to scanning circuits for asymmetrical or symmetrical D.C. (direct current) voltages on *n* input leads capable of being selectively connected to a single output lead.

A mechanical rotary switch or rotary selector has been employed in the past as such a scanning circuit. In these mechanical or electromechanical operated arrangements, the output voltage, as a rule, is equal to the input voltage, in other words, the ohmic resistance of a switching path is very small.

An electronic arrangement aimed at solving the same problem will cause an error, that is, the output voltage will no longer correspond exactly to the input voltage. This error appears independently of the type of circuit employed whenever the switching elements are semiconducting devices. In an individual case, however, a more or less good compensation is possible either accidently or by balancing. The electronic scanning circuits may be considered circuits known from the field of analog techniques which, however, are controlled in a digital way.

There are two kinds of circuits known in the prior art for electronically switching a D.C. voltage on and off. The first conventional type of circuit contains four diodes in a Graetz circuit in which voltages are applied at two oppositely disposed connecting points of the diodes, and in which the other two connecting points of the diodes represent the switching path. By appropriately selecting the applied voltage, either all four diodes are rendered conductive so that the switching path is connected through or else all four diodes are rendered non-conductive to block the switching path. There are also known circuit arrangements employing only two diodes. These circuits, however, have worse properties.

A second conventional type of circuit for the electronic switching of a D.C. voltage on and off is described in U.S. Pat. No. 2,962,603. In this arrangement there are employed two inversely operated transistors. The collector electrodes of the two transistors are connected to one another directly and the base electrodes are connected to one another across resistors. The emitter electrode of one transistor represents the input terminal and the emitter electrode of the other transistor represents the output terminal. Between the connecting point of the two collectors and the connecting point of the two resistors there is disposed the secondary winding of a transformer by which the entire arrangement is controlled. If both collector-base diodes are operated in the forward direction, the transistors are driven into saturation and a current is permitted to flow from the input to the output terminal. The voltage drops annul each other in the ideal case. The control by a transformer is necessary because, otherwise, the current symmetry would be disturbed. With respect to this circuit operation special types of transistors have been developed in which two emitters have been diffused into the base electrode.

These conventional circuits are not satisfactory with respect to the accuracy of the transmitted D.C. voltage, or the input resistance, or the switching speed, or the power loss.

SUMMARY OF THE INVENTION

An object of the present invention is to provide an electronic scanning circuit for D.C. voltages avoiding the aforementioned disadvantages of the prior art.

Another object of this invention is to provide a scanning circuit of the current amplifying type. If the scanner has an amplification differing from unity than the term "accuracy" also includes the stability of amplification (gain).

A feature of this invention is the provision of a current amplifying scanning circuit comprising differential amplifier means including one output stage coupled to a single output lead and a plurality of input stages each being coupled to a different one of a plurality of input leads; and control means coupled to the amplifier means to selectively couple a different one of the input stages to the output stage at different times.

Another feature of this invention is the provision in conjunction with the differential amplifier means spelled out above of an amplifier stage coupling the output stage to the output lead and a feedback path from the output lead to the output stage.

A further feature of this invention is the provision of operating the differential amplifier means from constant current sources.

BRIEF DESCRIPTION OF THE DRAWINGS

The above mentioned and other features and objects of this invention will become more apparent by reference to the following description taken in conjunction with the accompanying drawings, in which.

DESCRIPTION OF THE PREFERRED EMBODIMENT

Figure 1:
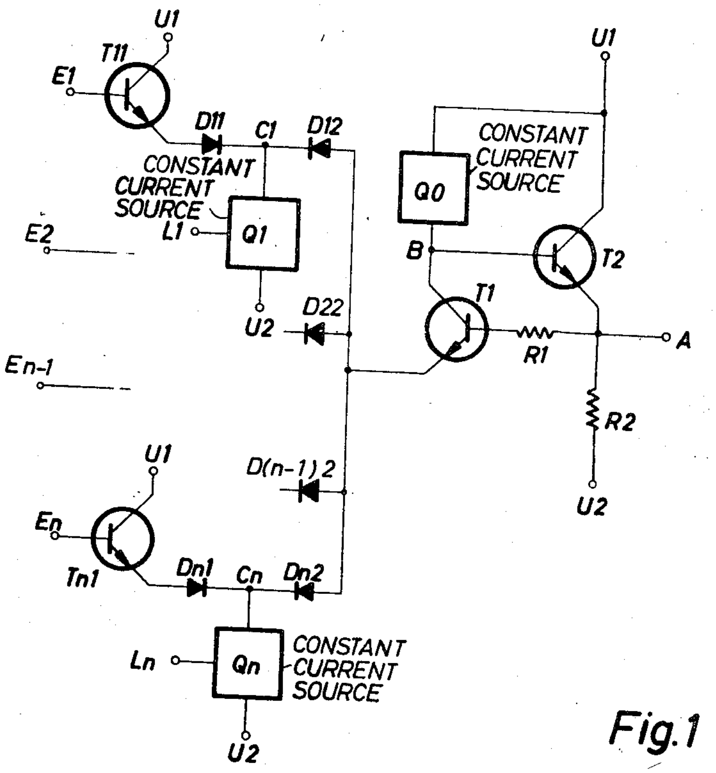
FIG. 1 is a schematic diagram partially in block form of the scanning circuit in accordance with the principles of this invention.

Referring to FIG. 1, the scanning circuit of the present invention is illustrated. It is appropriate to consider first only the differential amplifier as such and to explain thereafter that the input stage of the differential amplifier is provided *n* times.

Hence, the differential amplifier consists of a first transistor T11 and a second transistor T1. The second transistor whose output is designated B is followed by an additional transistor T2. The emitter electrode of transistor T2 is connected to the output terminal A. A feedback path is provided from output terminal A to the base electrode of transistor T1 by means of resistor R1.

This differential amplifier operates to amplify the difference between two voltages, one voltage being applied to the base of transistor T11 and the other voltage being applied to the base of transistor T1. In the ideal case, the value of the input voltages have no influence, only the difference voltage will be amplified. The output for this differential amplifier in accordance with this invention is the collector of transistor T11, namely, point B. Connected to this output is a class A amplifier which is of the emitter follower type as illustrated in FIG. 1. Accordingly, the entire arrangement represents a differential amplifyer having an input stage including transistor T11 and an output stage including transistor T1, where the collector of transistor T1 (point B) provides the differential amplifier output. A voltage variation in the positive sense of an input signal at the base of transistor T1 will cause a voltage variation in the negative sense at point B. The same voltage variation in the positive sense of an input voltage at the base of transistor T11 will cause a voltage variation at point B in the positive sense. In the circuit of FIG. 1, terminal A is connected to the base of transistor T1 so that this differential amplifier approaches the ideal case, that is, it substantially amplifiers only the difference between the voltages applied to the basis of transistors T1 and T11. As will be appreciated, this difference voltage is the difference between the input derived from point A and the input to the base of transistor T11. Thus, the differential amplifier arrangement above described overcomes the disadvantages of the prior art mentioned hereinabove under the heading "Background of the Invention."

As illustrated in FIG. 1, the emitter electrodes of the two transistors of the differential amplifier are not connected to one another directly but are connected to one another by means of oppositely polarized diodes D11 and D12. At the connecting point C1 of the two diodes there is connected a source of constant current capable of being switched on and off. The control input for this constant current source is designated L1.

Furthermore, the collector lead of transistor T1 has a second constant current source Q0 coupled thereto. The value of the voltages U1 and U2 and the value and types of the circuit components, such as resistor R1, transistors T1 and T11 and diodes D11 and D12, are chosen so that the sum of the currents in the emitters of transistors T11 and T1 is constant and equal to the current which is provided by the source of current Q1. The current flowing through transistor T1 is likewise fixed by the source of current Q0 in the collector circuit thereof. The current of source Q1 is adjusted in such a way that it is twice as high as the current of source Q0. In this way transistors T11 and T1 and diodes D11 and D12 will conduct the same current. In the case of equal conductivity properties of the transistors and the diodes, the voltage difference between E1 and C1 is equal to the voltage difference between A and C1, if resistor R1 is made equal to zero. Resistor R1 is provided to compensate for the error caused by the base current of transistor T11 causing a voltage drop across the internal resistor of the input voltage source.

Transistor T2 provides the base current for transistor T1 and keeps the resistance of the output terminal low. Transistor T2 may be replaced by a diode or a non-inverting amplifier with the anode of the diode or the input of the amplifier being connected to point B and the cathode of the diode or the output of the amplifier being connected to point A.

Instead of the single input stage provided by transistor T11 of the differential amplifier this stage has been provided *n* times, so that there will be provided an input stage for each of the *n* input terminals E1 to E*n*. In accordance with the problem to be solved, the control or selection arrangement must be designed in such a way that only one of the input stages T11 to T*n*1 is connected to the output stage T1 at each instant of time. For controlling the individual inputs, or the entire arrangement, sources of constant current Q1 . . . Q*n* having control inputs L1 . . . L*n* provide signals of suitable polarity to connect one of the input stages to the output stage and block the connection to the output stage of the other input stages.

Figure 2:
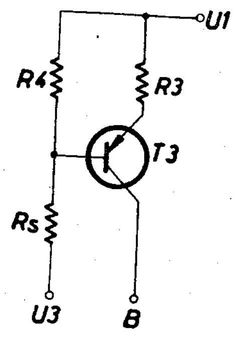
FIG. 2 is a schematic diagram illustrating one embodiment for realizing the constant current source Q0 of FIG. 1.

FIG. 2 illustrates one embodiment for realizing the source of current Q0 including transistor T3 and the resistors R3, R4 and R5.

Figure 3:
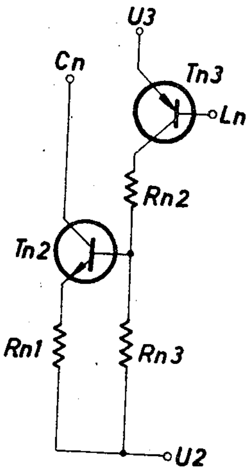
FIG. 3 is a schematic diagram of one embodiment of the constant current sources Q*n* and the control signal circuit therefor of FIG. 1.

FIG. 3 illustrates a first embodiment for switching the input stages on or off. According to this figure, upon application of a positive voltage to L*n*, switching transistor T*n*3 is blocked, so that the current source transistor T*n*2 will no longer receive base current and is likewise blocked. Accordingly, the source of constant current is disconnected and the connection between the input stage and the output stage is effectively open. By providing a negative voltage at L*n* current is provided at point C*n* and one of the input stages will then be coupled to the output stage since the coupling path will now be effectively closed.

Figure 4:
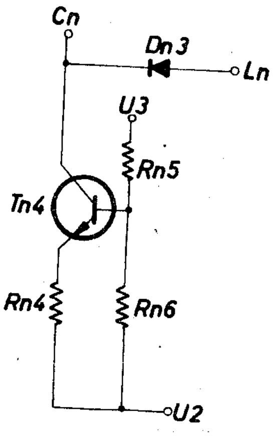
FIG. 4 is a schematic diagram of a second embodiment of the constant current sources Q*n* and the control signal circuit therefor of FIG. 1.

Referring to FIG. 4, another embodiment of the switching control of the constant current source is illustrated. Upon application of a high positive voltage to terminal L*n* the potential at point C*n* is raised to such an extent that diodes D*n*1 and D*n*2 are blocked and the connection between the input stage and the output stage is effectively open. Conversely, by providing a negative voltage at terminal L*n* the potential at point C*n* is reduced rendering diodes D*n*1 and D*n*2 conductive and the connection between the input stage and the output stage is effectively closed.

In the arrangements illustrated in FIGS. 3 and 4, an inactive terminal E*n* is only connected to the fixed potentials by the barrier layers of transistors and diodes. When employing suitable components, it is possible to obtain an extremely high barrier or blocking input reactance (100 megohms and more).

A further advantage of the scanning circuit of this invention is in the fact that by designing the sources of constant current Q1 . . . Q*n* and the on-off switching characteristics thereof the current consumption of the inactive inputs (only one being connected) will practically become zero. On account of this, even in the case of a large number of inputs, the total current consumption of the circuit will remain small. This is of particular importance with respect to telemetering systems for use aboard space vehicles.

The accuracy of the scanning circuit of this invention is determined by the extent that the conductivity properties of the transistors T11 to T*n*1 are matched with the conductivity properties of the transistor T1.

A symmetrical scanning circuit will result when both terminals of the input voltages to be transferred are each applied to one D.C. voltage scanner according to the present invention with the output of the circuit consisting of the output terminals of the two D.C. voltage scanners. In this kind of circuit arrangement, it is particularly easy to achieve a high degree of accuracy because the respective semiconductor components of the two scanning circuits only need to having matched conductivity properties in pairs. With the symmetrical type of circuit, it is also possible to transfer ungrounded voltages.

While I have described above the principles of my invention in connection with specific apparatus it is to be clearly understood that this description is made only by way of example and not as a limitation to the scope of my invention as set forth in the objects thereof and in the accompanying claims.

I claim:

1. A current amplifying scanning circuit comprising:
a plurality of input leads;
one output lead;
differential amplifier means including
one output stage including a single transistor coupled to said output lead, and
a plurality of input stages each including a single transistor and being coupled to a different one of said input leads;

control means coupled to said amplifier means to selectively couple a different one of said input stages to said output stage at different times;

an amplifier stage coupling said output stage to said output lead; and a feedback path from said output lead to said output stage.

2. A circuit according to claim 1, wherein said control means includes a pair of oppositely polarized diodes coupled in tandem between each of said input stages and said output stage, a constant current source coupled to the junction of each of said pair of diodes, and a control signal circuit coupled to each of said current sources to control the coupling of said input stages to said output stage.

3. A circuit according to claim 2, wherein each of said current sources has its output coupled directly to said junction of the associated one of said pair of diodes; and the associated one of said control signal circuits controls the conduction of current from said current sources to said junction.

4. A circuit according to claim 2, wherein each of said current sources has its output coupled directly to said junction of the associated one of said pair of diodes; and the associated one of said control signal circuits is coupled directly to said junction to control the potential thereof for conduction and non-conduction of the associated one of said pair of diodes.

5. A circuit according to claim 2, wherein said output stage includes a constant current source coupled thereto.

6. A circuit according to claim 5, wherein said constant current sources of said control means provides a current having a value twice as high as the value of current provided by said constant current source of said output stage.

7. A circuit according to claim 6, wherein said output stage includes a first transistor having emitter, base and collector electrodes;

each of said input stages includes a second transistor having emitter, base and collector electrodes;

each of said pair of diodes are coupled between said emitter electrode of each of said second transistors and said emitter electrode of said first transistor; and said constant current source of said output stage is coupled to said collector electrode of said first transistor.

8. A current amplifying scanning circuit comprising:

a plurality of input leads;

one output lead;

differential amplifier means including one output stage including a single transistor coupled to said output lead, and a plurality of input stages each including a single transistor and being coupled to a different one of said input leads; and control means coupled to said amplifier means to selectively couple a different one of said input stages to said output stage at different times;

said control means including a pair of oppositely polarized diodes coupled in tandem between each of said input stages and said output stage, a constant current source coupled to the junction of each of said pair of diodes, and a control signal circuit coupled to each of said current sources to control the coupling of said input stages to said output stage.

9. A circuit according to claim 8, wherein said output stage includes a first transistor having emitter, base and collector electrodes;

each of said input stages includes a second transistor having emitter, base and collector electrodes; and each of said pair of diodes are coupled between said emitter electrode of each of said second transistors and said emitter electrode of said first transistor.

References Cited

UNITED STATES PATENTS

| | | | |
|---|---|---|---|
| 2,679,554 | 5/1954 | Hurford | 330—69 |
| 3,213,290 | 10/1965 | Klein | 307—242 |
| 3,248,567 | 4/1966 | Quinlan | 307—243 |
| 3,431,505 | 3/1969 | D'Agostino | 330—69 |

JOHN S. HEWMAN, Primary Examiner

D. M. CARTER, Assistant Examiner

U.S. Cl. X.R.

307—241; 330—30